United States Patent [19]

Nieh et al.

[11] Patent Number: 5,075,243
[45] Date of Patent: Dec. 24, 1991

[54] FABRICATION OF NANOMETER SINGLE CRYSTAL METALLIC $CoSi_2$ STRUCTURES ON SI

[75] Inventors: Kai-Wei Nieh, Monrovia; True-Lon Lin, Cerritos; Robert W. Fathauer, Sunland, all of Calif.

[73] Assignee: The United States of America as represented by the Administrator of the National Aeronautics and Space Administration, Washington, D.C.

[21] Appl. No.: 677,373

[22] Filed: Mar. 27, 1991

Related U.S. Application Data

[63] Continuation of Ser. No. 392,166, Aug. 10, 1989, abandoned.

[51] Int. Cl.⁵ .......................................... H01L 21/265
[52] U.S. Cl. .................................. 437/40; 437/973; 437/935; 437/942; 437/907; 437/200; 148/DIG. 46; 148/DIG. 48; 148/DIG. 154
[58] Field of Search ................ 437/40, 907, 970, 973, 437/935, 942, 200; 156/628; 148/DIG. 46, DIG. 48, DIG. 154

[56] References Cited

U.S. PATENT DOCUMENTS

| | | | |
|---|---|---|---|
| 4,554,045 | 11/1985 | Bean et al. | 156/DIG. 102 |
| 4,555,301 | 11/1985 | Gibson et al. | 156/DIG. 102 |
| 4,755,256 | 7/1988 | Ditcheck | 156/DIG. 73 |
| 4,816,421 | 3/1989 | Dynes et al. | 437/25 |
| 4,855,014 | 8/1989 | Kakimoto et al. | 156/603 |
| 4,897,150 | 1/1990 | Dooley et al. | 156/628 |

Primary Examiner—Brian E. Hearn
Assistant Examiner—Trung Dang
Attorney, Agent, or Firm—Thomas H. Jones; Harold W. Adams; John R. Manning

[57] ABSTRACT

Amorphous Co:Si (1:2 ratio) films (12) are electron gun-evaporated on clean Si(111) substrates (10), such as in a molecular beam epitaxy system. These layers are then crystallized selectively with a focused electron beam (14) to form very small crystalline $CoSi_2$ regions (12') in an amorphous matrix. Finally, the amorphous regions are etched away selectively using plasma or chemical techniques.

16 Claims, 1 Drawing Sheet

FABRICATION OF NANOMETER SINGLE CRYSTAL METALLIC CoSi₂ STRUCTURES ON SI

ORIGIN OF THE INVENTION

The invention described herein was made in the performance of work under a NASA contract, and is subject to the provisions of Public Law 96-517 (35 U.S.C. 202) in which the Contractor has elected not to retain title.

This is a continuation of co-pending application Ser. No. 07/392,166 filed on Aug. 10, 1989, now abandoned.

TECHNICAL FIELD

The invention relates to transistors and other structures having lateral dimensions on the order of nanometers, and, more particularly, to a method for fabricating such structures.

BACKGROUND ART

Modification of the microstructure of thin films by energy beams has been extensively studied. Electron beams and lasers have been used for rapid surface heating. Ion beams at energies of 10 to $10^3$ KeV have been widely applied to thin film processing such as surface heating, ion-implantation, and ion mixing.

Recently, ion beams have been used to enhance a number of thermally activated processes, including grain growth of polycrystalline silicon and germanium films, diffusion of gold in amorphous silicon, and epitaxial growth of amorphous silicon on crystalline silicon.

Electrons, being charged particles, interact with the solid strongly. Generation of point defects by high-energy electrons in various semiconductors has been reported. Electron radiation damage on metals and electron induced amorphization of alloys have been studied. However, due to its small mass, the electron is not effective in displacing atoms as ions. The effect of electron irradiation on the microstructure of thin films has not been extensively studied.

Increasingly small structures are required for a variety of microelectronic devices. There are currently no techniques which readily allow fabrication of structures with the desired dimensions for several applications.

STATEMENT OF THE INVENTION

Accordingly, it is an object of the invention to provide a method for fabricating small structures having lateral dimensions on the order of nanometers.

It is another object of the invention to provide a method for fabricating small-scale structures in semiconductor devices.

It is yet another object of the invention to provide a method for fabricating small-scale gates in silicon field effect transistors (FETs).

Briefly, in accordance with the invention, a portion of an amorphous film deposited on a substrate is crystallized to form either a single crystal portion or a polycrystalline portion, by exposure of the portion to an electron beam. The amorphous regions remaining are then removed, leaving behind the crystallized portion, which is of sub-micrometer lateral dimension, and with appropriate electron beam size, may approach nanometer dimension.

Other objects and benefits of the invention will become apparent from the description which follows hereinafter when taken in conjunction with the following figures which accompany it.

DETAILED DESCRIPTION OF THE INVENTION

The fabrication of structures with lateral dimensions on the order of nanometers is extremely difficult. Special techniques are required, all of which have limitations, particularly for dimensions below 100 nm (0.1 μm). Applications of such structures in the case of metals include quantum wires and dots, and gates and other features for various transistors, including MESFETs and MOSFETs. In addition, use of a metallic layer as an electron-beam resist would allow transfer of the nanometer- C scale pattern to non-metallic materials.

The method described herein allows the fabrication of metallic structures with extremely small lateral dimensions. The metallic structures are formed on a substrate, which may comprise any material, such as silicon or other semiconductor or oxide thereof (e.g., silicon dioxide), whether single crystalline, polycrystalline, or amorphous. Other well-known substrate materials, such as $CaF_2$, may also be employed in the practice of the invention.

The metallic structure is initially formed in the amorphous state on the surface of the substrate. While the amorphous material specifically disclosed herein is cobalt:silicon, other materials capable of controlled crystallization are also contemplated by the invention.

The deposition of the amorphous structure is achieved by any of the well-known deposition methods, such as molecular beam epitaxy. The amorphous structure is deposited in the stoichiometry of the final crystallized structure.

The amorphous structure is converted to a crystalline metallic structure by exposure to an electron beam at the appropriate energy and dose. For example, amorphous Co:Si layers crystallize at room temperature under an electron beam. Selectivity in the etching rates of amorphous and single-crystal CoSi₂ may then be exploited to remove the amorphous regions, leaving quantum wires and dots or other features on a silicon substrate. This processing sequence is shown schematically in FIGS. 1-3.

Figure 1:
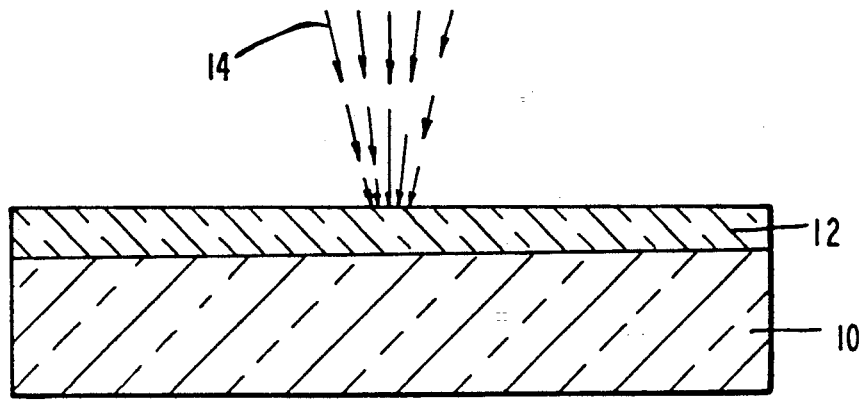
FIGS. 1-3 are cross-sectional views of a silicon substrate which is processed in accordance with the teachings of the invention.

In particular, FIG. 1 illustrates a silicon substrate 10 having formed thereon a layer 12 of amorphous cobalt-:silicon (Co:Si), deposited in the stoichiometric ratio of 1:2. The amorphous Co:Si layer 12 is deposited to a thickness of about 10 to 1,000 Å. The thickness is dictated by penetration of the layer by electrons without significant loss of energy.

A focused electron beam 14 is then directed onto the surface of the Co:Si layer 12. By focused is meant the smallest possible beam size available with the e-beam equipment. In the discussion herein, that beam size is 200 nm; beam sizes as low as 5 nm are presently available.

Figure 2:
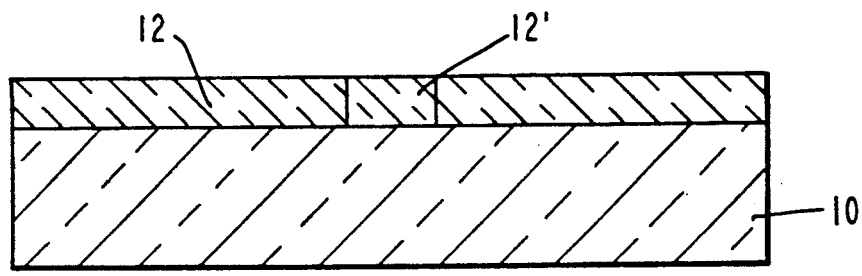

The effect of the electron beam is to induce epitaxial growth in the exposed region. As seen in FIG. 2, that portion 12' of the amorphous Co:Si layer 12 exposed to the electron beam is converted into single-crystal CoSi₂.

Figure 3:
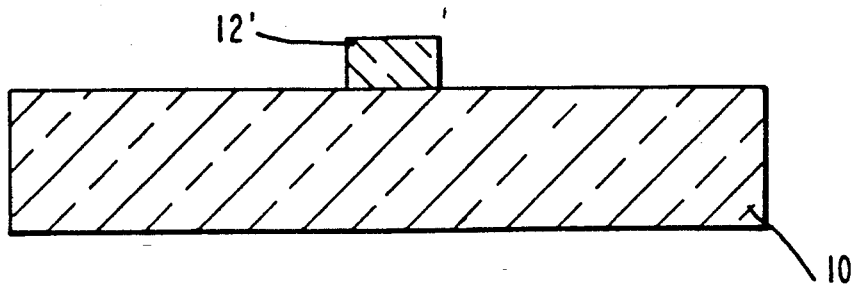

The amorphous Co:Si layer 12 is then removed, as shown in FIG. 3, leaving the single-crystal structure on the silicon substrate. Thus, it will be readily appreciated that a resistless process is provided.

The technique of solid phase epitaxy of an amorphous CoSi (1:2) layer allows the formation of epitaxial $CoSi_2$ on Si(111) at very low temperatures. The stoichiometric ratio of the amorphous deposit is the key to obtaining low temperature formation, as it prevents the formation of intermediate silicide phases (as is observed for the more conventional silicide formation method of reacting a metal layer into a silicon substrate). We have observed the presence of very small single-crystal regions in amorphous Co:Si (1:2) layers. Under TEM observation at room temperature, the regions grow laterally to yield single-crystal epitaxial $CoSi_2$ regions of greater extent.

By using a focused electron beam, we have successfully fabricated 300-nm-wide single crystal $CoSi_2$ lines in a 10-nm-thick Co:Si amorphous matrix on a silicon(111) substrate. Bright-field and dark-field TEM micrographs have been taken of a planar section of the sample, where the characters "$CoSi_2$" were crystallized in the amorphous layer. In one case, a $CoSi_2$ diffraction spot was used to form the image, so that only the single-crystal $CoSi_2$ regions appeared bright. The epitaxial growth of the $CoSi_2$ was induced by a 300 keV electron beam with an emission current of 10 $\mu$A in a Philips 430 scanning TEM. We find that the epitaxial $CoSi_2$ is sharply confined in the electron-beam bombarded area, with the amorphous Co:Si unchanged 10 nm away from the beam.

These results imply that selective crystallization in an electron-beam lithography system will be possible. Such systems have typical spot sizes of approximately 8 nm, which would allow the formation of structures of single-crystal material with dimensions down to 28 nm or less. (The value of 28 nm is obtained by adding the 8-nm spot size to 10-nm mentioned above for each side of a line.) It should be noted that electron-beam lithography with resist technology is limited to approximately 40 nm minimum features.

The single-crystal $CoSi_2$ structures would be embedded in the surrounding amorphous Co:Si. The amorphous Co:Si could be removed selectively using a suitable etching technique. We have found that amorphous Co:Si (1:2) is etched by $HF:H_2O$ (1:9) at a rate of approximately 3 Å/sec. Single-crystal $CoSi_2$, on the other hand, is attacked by this same solution much more slowly, by at least an order of magnitude. This selectivity is adequate for the purpose of removing the amorphous Co:Si without adversely affecting the single-crystal $CoSi_2$. (Several other chemical or dry etching techniques would probably also be suitable.) Single-crystal metallic structures may thus be fabricated on a silicon substrate.

In order to obtain crystallization of a portion 12' of the amorphous layer 12, the energy of the electron beam must be at least about 100 keV, and preferably about 200 to 300 keV. If the energy is higher than this, the electrons will pass through the layer 12 into the substrate 10, still crystallizing the portion 12', but possibly not as much as at the indicated preferred range.

An alternative method to achieve crystallization employs electron beam energy at a level of less than 100 keV, and preferably in the range of about 20 to 50 keV. The preferred range is easily achievable with the electron beam apparatus commercially available for use with electron beam resist technology. While this alternative method is certainly useful, it is not as preferred as operating at the higher energy range, since it relies on heating to achieve the crystallization. Such heating is on the order of 150° C., and results in broadening of the exposed portion 12' by about 50%, in contrast to the higher energy exposure, which evidences essentially no broadening.

The dose rate is at least about $10^{21}$ cm$^{-1}$min$^{-1}$; less than that rate results in an unacceptably slow growth rate. At the indicated dose rate, crystallization proceeds at a lateral rate of a few Angstroms per minute. Higher dose rates correspondingly result in higher crystallization rates.

The portion 12' is exposed to the electron beam 14 for a period of time to effect complete conversion of the portion 12, to single crystal (or polycrystalline material). Under the conditions disclosed above (energy of about 300 keV and dose of 10 cm$^{-1}$min$^{-1}$), about five minutes exposure is sufficient to convert the amorphous Co:Si to crystalline cobalt silicide.

There are a number of potential application of this technology. One of these is the fabrication of fine wires and dots exhibiting quantized confinement of carriers. Such structures will probably require dimensions of a few tens of nanometers or less (sub-micrometer dimensions). There has been no clear demonstration of these structures to date, but they are expected to exhibit novel conduction and optical absorption properties.

The method of the invention is not necessarily limited to single-crystal silicon substrates. For example, if an insulating substrate were desired, epitaxial $CaF_2$ on silicon would likely prove suitable. In addition, polycrystalline $CoSi_2$ with small dimensions would be formed on polycrystalline silicon, $SiO_2$ or other materials. This could find application in submicrometer-gate-length transistors (such as MESFETs or MOSFETs) as a gate electrode. While the etching rate of polycrystalline $CoSi_2$ is expected to be faster than that of the single-crystal material, it is still expected to be several times slower than amorphous material.

Finally, the $CoSi_2$ may be used as an electron-beam resist. Our preliminary results indicate that smaller dimensions may be achievable using this technique than can be realized with photoresist techniques. The patterned $CoSi_2$ could be used as a mask to etch underlying materials. Etching techniques which do not readily attack $CoSi_2$ would be required. Examples are plasma etching in CF. and chemical etching in dilute $HF:H_2O$ or phosphoric acid.

While the formation of crystalline cobalt silicide is discussed above, other amorphous materials, such as Ir:Si, may be similarly crystallized. The determination of such materials is not considered undue experimentation; deposition of the material under conditions to form an amorphous structure at the appropriate stoichiometry and exposure to an electron beam under the conditions discussed above will readily reveal whether the material is suitably employed in the practice of the invention.

Thus, metallic features, such as $CoSi_2$ are formed on a substrate, having sub-micrometer lateral dimensions. It will be appreciated by those skilled in the art that various changes and modifications of an obvious nature may be made without departing from the spirit and scope of the invention, and all such changes and modifications are considered to fall within the scope of the invention as defined by the appended claims.

We claim:

1. Method for forming features on a substrate, said features having sub-micrometer lateral dimensions comprising:
   (a) forming an amorphous coating on said substrate, said amorphous coating comprising a material capable of controlled crystallization;
   (b) exposing a portion of said material to a focussed electron beam for a period of time and with sufficient electron energy and dose to crystallize said portion, said electron energy ranging from about 20 to 300 keV, while maintaining said coating at a temperature ranging from room temperature to 150° C., the lower temperatures being associated with the higher electron energies; and
   (c) removing all amorphous coating remaining, leaving said crystallized portion on said substrate.

2. The method of claim 1 wherein said substrate comprises a material selected from the group consisting of silicon, silicon dioxide, and $CaF_2$.

3. The method of claim 2 wherein said amorphous coating comprises a material selected from the group consisting of cobalt:silicon and iridium:silicon.

4. The method of claim 3 wherein said amorphous coating consists essentially of cobalt:silicon in an atomic ratio of Co:Si of 1:2.

5. The method of claim 4 wherein said crystallized portion comprises $CoSi_2$.

6. The method of claim 1 said electron energy ranges from about 200 to 300 keV and said coating is maintained at about room temperature.

7. The method of claim 1 wherein said electron energy ranges from about 20 to 50 keV and wherein said elevated temperature is about 150° C.

8. The method of claim 1 wherein said dose is at least about $10^{21}$ cm$^{-1}$min$^{-1}$.

9. The method of claim 1 wherein said substrate comprises silicon, said amorphous coating comprises Co:Si, deposited in a stoichiometric ratio of 1:2, and said crystallized portion comprises $CoSi_2$.

10. A method for fabricating field effect transistors having submicrometer gate lengths comprising:
    (a) forming a polycrystalline coating on a layer of silicon dioxide, said polycrystalline coating comprising a material capable of controlled crystallization;
    (b) exposing a portion of said material to a focussed electron beam for a period of time and with sufficient electron energy and dose to convert said portion to a single crystal portion, said electron energy ranging from about 20 to 300 keV, while maintaining said coating at a temperature ranging from room temperature to 150° C., the lower temperatures being associated with the higher electron energies; and
    (c) removing all polycrystalline coating remaining, leaving said single-crystal portion on said substrate.

11. The method of claim 10 wherein said polycrystalline coating comprises cobalt:silicon.

12. The method of claim 11 wherein said polycrystalline coating consists essentially of cobalt:silicon in an atomic ratio of Co:Si of 1:2.

13. The method of claim 12 wherein said single-crystal portion comprises $CoSi_2$.

14. The method of claim 10 said electron energy ranges from about 200 to 300 keV and said coating is maintained at a temperature of about 150° C.

15. The method of claim 10 wherein said electron energy ranges from about 20 to 50 keV and wherein said elevated temperature is about 150° C.

16. The method of claim 10 wherein said dose is at least about $10^{21}$ cm$^{-1}$min$^{-1}$.

* * * * *